United States Patent [19]
Ahuja

[11] Patent Number: 5,909,187
[45] Date of Patent: Jun. 1, 1999

[54] CURRENT STEERING CIRCUIT FOR A DIGITAL-TO-ANALOG CONVERTER

[75] Inventor: Bhupendra K. Ahuja, Fremont, Calif.

[73] Assignee: C-Cube Microsystems, Milpitas, Calif.

[21] Appl. No.: 08/918,344

[22] Filed: Aug. 26, 1997

[51] Int. Cl.$^6$ ................................................. H03M 1/66
[52] U.S. Cl. ........................... 341/136; 341/135; 341/144
[58] Field of Search .................................. 341/136, 135, 341/144; 327/80, 434, 436

[56] References Cited

U.S. PATENT DOCUMENTS

| | | | |
|---|---|---|---|
| 4,056,740 | 11/1977 | Schoeff | 341/133 |
| 5,148,165 | 9/1992 | Phillips | 341/136 |

*Primary Examiner*—Marc S. Hoff
*Assistant Examiner*—Peguy JeanPierre
*Attorney, Agent, or Firm*—Fish & Richardson P.C.

[57] ABSTRACT

An improved current steering cell for a DAC which eliminates the need for an inverter reduces the noise at the common mode. The cell includes a first and a second current steering MOS transistor of a first polarity type, each having a gate and a pair of current passing terminals. The cell has an input terminal for receiving digital input signals coupled to the gate of the first of the pair of current steering transistors, and a common mode node for receiving an input current coupled to the same one of the pair of current passing terminals of each current steering MOS transistor. The current output terminal of the cell is coupled to the other of the pair of current passing terminals of the first of the current steering MOS transistors. Finally, the cell includes a third MOS transistor of the opposite polarity type to the current steering MOS transistors, having a gate and a pair of current passing terminals for passing a current through the transistor, the gate of the third MOS transistor being coupled to the gate of the first MOS current steering transistor, and the current passing terminals of the third MOS transistor being coupled between the gate of the second MOS current steering transistor and one of the pair of current passing terminals of the second MOS current steering transistor.

11 Claims, 3 Drawing Sheets

CURRENT STEERING CIRCUIT FOR A DIGITAL-TO-ANALOG CONVERTER

BACKGROUND AND PRIOR ART OF THE INVENTION

This invention relates to a method and apparatus for current steering in a digital-to-analog converter (DAC). Most DACs require a current steering cell in order to provide glitch-free operation at the output. Current steering cells require complementary input signals. Prior art cells generated these input signals by using an input signal of one polarity and passing it through an inverter to generate the complementary signal. Such a prior art steering cell is shown in FIG. 1.

Bias voltages $bv_1$ and $bv_2$ are fed to bias voltage input terminals 201 and 202, respectively. Representative bias voltages may be 2.0 v and 1.5 v, respectively, for a supply voltage of 3.3 v. Transistors 203 and 204 are the cascode current source transistors for the current steering cell. Cascode transistors 203 and 204 set the biases necessary to establish the current I through the cell. They are of the same polarity type (P-channel in the example), and also are of the same polarity type as the current steering transistors 205 and 206 (which are also P-channel).

Some prior art current steering circuits use a single transistor instead of two transistors 203 and 204, but the cascoded pair of transmitters shown in FIG. 1 provides a higher output impedance. Ideal current sources have infinite output impedance.

Logic cell 207 provides the input signal to line 208, which is coupled to the respective gates of P-channel current steering transistors 205 and 206. Line 208 is coupled directly to the gate of transistor 205, and is coupled through inverter 209 to the gate of transistor 206. As discussed above, inverter 209 ensures that steering transistors 205 and 206 will receive complementary inputs.

The complementary input signals to P-channel steering transistors 205 and 206 cause disturbance of the common mode signal at node 210, which in turn causes disturbance in the value of the cell current I appearing at terminal 211.

SUMMARY OF THE INVENTION

To overcome the problems caused by the common mode disturbance and the need for an inverter in prior art current steering cells, an improved current steering cell for a DAC has been invented which eliminates the need for the inverter, and also reduces the noise appearing at the common mode. The improved current steering cell of the invention includes a first and second current steering MOS transistors of a first polarity type, each having a gate and a pair of current passing terminals for passing a current through the transistors. The cell has an input terminal for receiving digital input signals coupled to the gate of the first of the pair of current steering transistors, and a common mode node for receiving an input current coupled to the same one of the pair of current passing terminals of each current steering MOS transistor. The current output terminal of the cell is coupled to the other of the pair of current passing terminals of the first of the current steering MOS transistors. Finally, the cell includes a third MOS transistor of the opposite polarity type to the current steering MOS transistors, having a gate and a pair of current passing terminals for passing a current through the transistor, the gate of the third MOS transistor being coupled to the gate of the first MOS current steering transistor, and the current passing terminals of the third MOS transistor being coupled between the gate of the second MOS current steering transistor and one of the pair of current passing terminals of the second MOS current steering transistor.

DESCRIPTION OF THE PREFERRED EMBODIMENT

Figure 2:
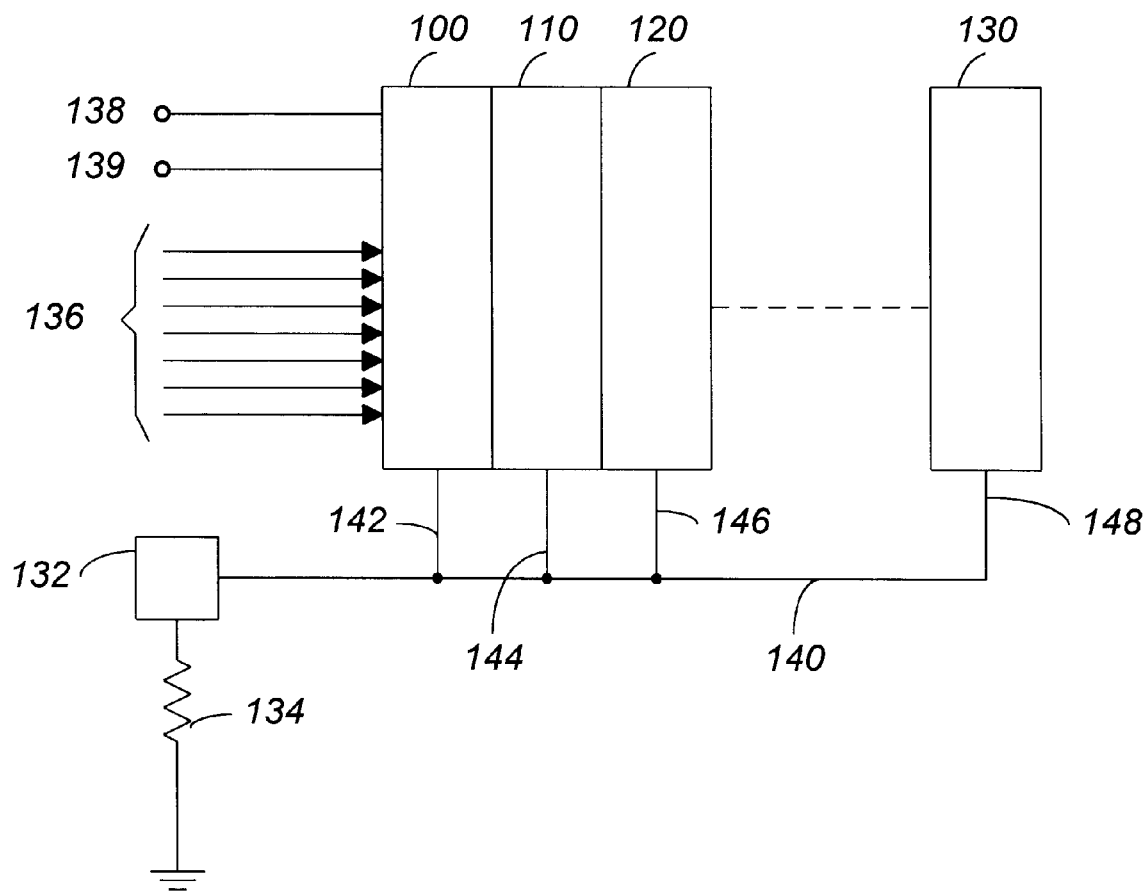
FIG. 2 is a schematic and block diagram of the DAC of the invention.

Referring to FIG. 2, a DAC is shown having a plurality of current cells 100, 110, 120 and 130. As is known in the art, a DAC normally requires $2^n$ current steering cells, where n=the number of input bits to the DAC. For example, a 7-bit DAC requires 128 cells. The seven input lines 136 in the example receive the seven bits of digital input data. The bias voltages $bv_1$ and $bv_2$ are fed to terminals 138 and 139. The output lines 142, 144, 146 and 148 of cells 100, 110, 120 and 130, respectively, are connected to a common output line 140 and to an output terminal 132, preferably a pin of the DAC chip. Output terminal 132 is biased external to the chip using resistor 134 connected between terminal 132 and ground.

Figure 3:
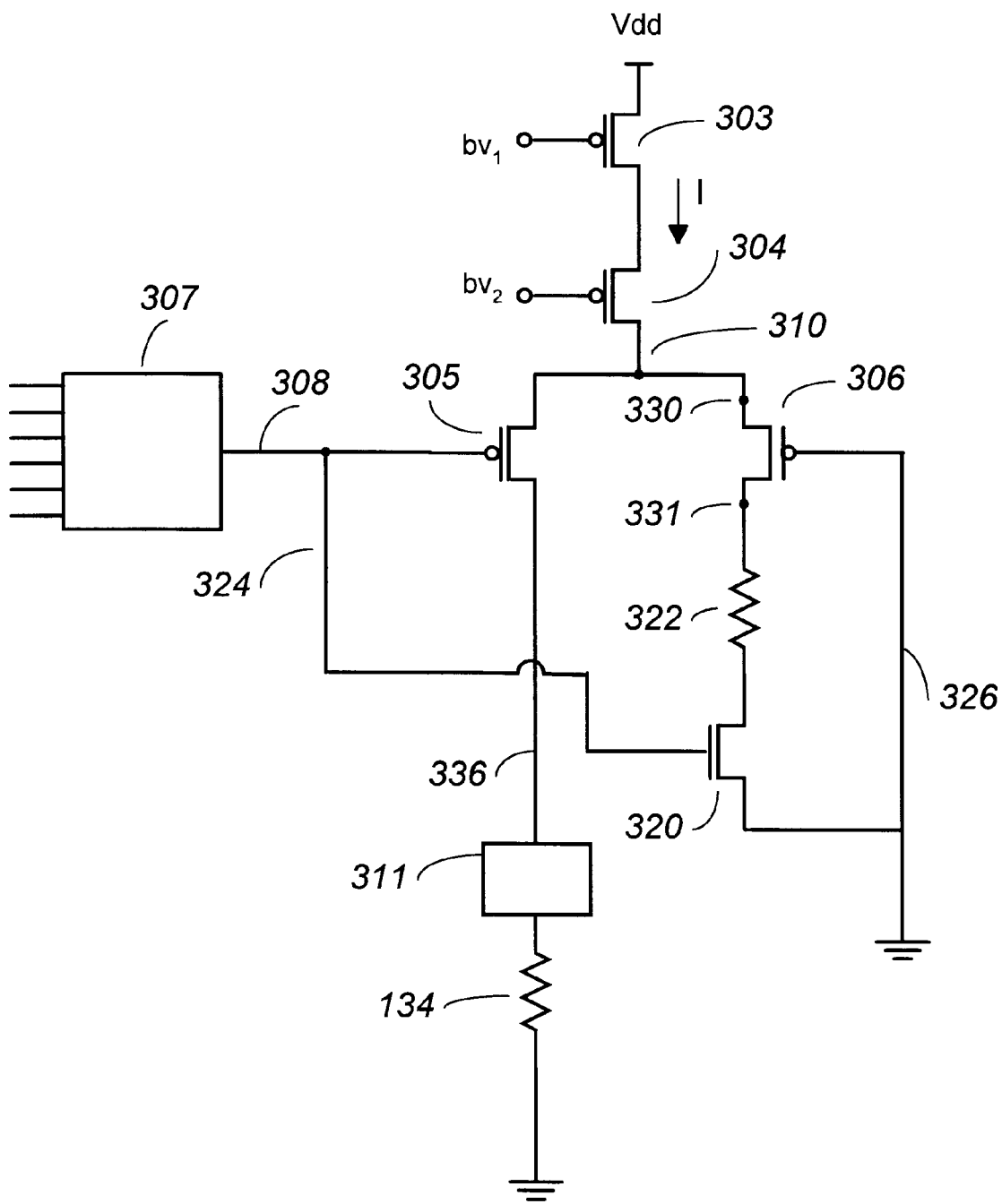
FIG. 3 is a schematic and block diagram of a current steering cell of the DAC of the invention.

One of the current steering cells 100, 110, 120 and 130 shown in FIG. 2 is shown in more detail in FIG. 3.

Referring to FIG. 3, logic cell 307 provides the input signals to the current steering cell. P-channel cascode current source transistors 303 and 304 perform the same function as in the prior art cell shown in FIG. 1, discussed above. P-channel current steering transistors 305 and 306 also perform the same function. Cascode current source MOS transistors 303 and 304 preferably are the same polarity type (P-channel in the preferred embodiment) as current steering MOS transistors 305 and 306. The common mode signal appears at node 310.

Contrary to the prior art, the current steering cell of FIG. 3 does not employ an inverter. Accordingly, the cell of the invention avoids complementary signal generation entirely. Instead, the gate of N-channel transistor 320 is connected to input line 308. Transistor 320 must be of the opposite polarity type (i.e., N-channel) to the P-channel current steering cell transistors 305 and 306. N-channel transistor 320 has two current passing terminals, a drain and a source terminal, and a gate terminal. One of the current passing terminals, preferably the drain of transistor 320 is connected through resistor 322 to the drain of P-channel steering transistor 306. The other current passing terminal, the source, of N-channel transistor 320 is connected to ground. The gate of steering transistor 306 is also connected to ground, as shown, through line 326.

In operation, when the signal on input line 308 goes high, placing a high signal at the gate of P-channel steering transistor 305, P-channel transistor 305 is turned off. The same signal also flows through line 324 to the gate of N-channel transistor 320, causing that transistor to turn on and allowing the current I of the cell to flow through the current passing terminals 330 and 331 of P-channel transistor 306, which is always on, through resistor 322 and N-channel transistor 320, to internal ground at line 326.

On the other hand, when the input on line 308 goes low, N-channel transistor 320 turns off and P-channel transistor 305 turns on, causing the current I to flow through current passing terminals 332 and 334 of transistor 305 through line 336 into output terminal 311. No matter whether the input on line 308 is high or low, P-channel transistor 306 is always on.

It is preferable in the cell of the invention to match the output resistance seen by either MOS steering transistor 305 or 306. Accordingly, the resistance of resistor 322 is calculated to be $\frac{1}{2} \times 2^n \times R$, where n=the number of input bits to the DAC and R=the resistance of external resistor 134. Resistor 134 is the output resistor of the DAC, coupled between output terminal 311 of each of the current steering cells 100, 110, 120 and 130 shown in FIG. 2, and ground. As an example, assuming the DAC is a 7-bit DAC, $2^7$ equals 128. One-half of 128 is 64. Assuming resistor 134 is, for example, 37.5 ohms, the resistance of resistor 322 in ohms is 64×37.5, or approximately 2.4 Kohms.

Figure 1:
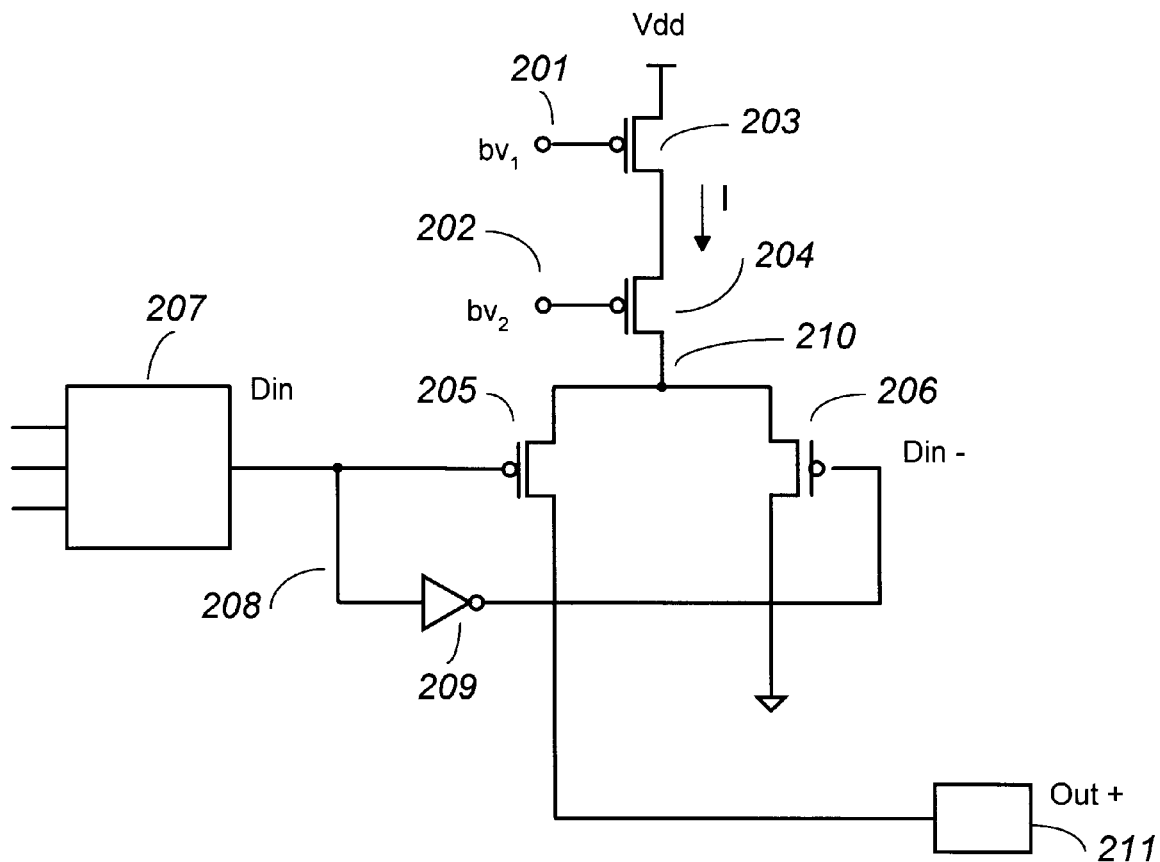
FIG. 1 is a schematic and block diagram of a prior art current steering cell.

One of the advantages of the current steering cell of the invention is a considerable saving in chip area resulting from eliminating the inverter 209 of the prior art circuit shown in FIG. 1. Since a 7-bit DAC requires 128 current steering cells, 128 such inverters are eliminated. Not only is the chip area required for the inverters saved, but also the area required for routing the connection wires for such inverters are eliminated, and less power is required to power the resulting DAC. These savings greatly exceed any increase in area and power requirements as a result of the addition of the single N-channel transistor 320.

Using the cell of the invention shown in FIG. 3, transistor 306 has its gate tied to ground and is not switched, reducing the disturbance at the common mode node 310 caused by the prior art current steering cells where both transistors 205 and 206 (FIG. 1) are switched, resulting in substantially glitch-free operation of the DAC.

As will be understood by those skilled in the art, many changes in the method and apparatus described above may be made by the skilled practitioner without departing from the spirit and scope of the invention, which should be limited only as set forth in the claims which follow.

What is claimed is:

1. A current steering circuit comprising:

first and second current steering MOS transistors of a first polarity type, each having a gate and a pair of terminals for passing a current through the transistors, an input terminal for receiving digital input signals coupled to the gate of the first of the pair of current steering transistors;

a common mode node for receiving an input current coupled to the same one of the pair of current passing terminals of each current steering MOS transistor;

a current output terminal coupled to the other of the pair of current passing terminals of the first of the current steering MOS transistors; and a third MOS transistor of the opposite polarity type to the pair of current steering MOS transistors having a gate and a pair of terminals for passing a current through the transistor, the gate of the third MOS transistor being coupled to the gate of the first MOS current steering transistor and the terminals for passing a current through the third MOS transistor being coupled between the gate of the second MOS current steering transistor and, through a first resistor to one of the pair of terminals for passing a current through the second MOS current steering transistor, the first resistor having a resistance selected to match the output resistance seen by either of pair of the current steering MOS transistors.

2. The current steering circuit of claim 1 wherein the first and second current steering MOS transistors are P-channel and the third MOS transistor is N-channel.

3. The current steering circuit of claim 1 wherein the gate of the second MOS current steering transistor is coupled to a first point of fixed potential.

4. The current steering circuit of claim 1 having a pair of conductively biased, cascaded fourth and fifth MOS transistors coupled between a second point of fixed potential of opposite polarity to the first point of fixed potential and the common mode node, for passing current to the common mode node.

5. The current steering circuit of claim 4 wherein the fourth and fifth MOS transistors are the same polarity type as the first and second MOS current steering transistors.

6. The current steering circuit of claim 1 wherein the digital signals are input signals to a DAC.

7. A current steering circuit comprising:

first and second current steering MOS transistors of a first polarity type, each having a gate and a pair of terminals for passing a current through the transistors, an input terminal for receiving digital input signals to a DAC which has n input bits, the digital input signals being coupled to the gate of the first of the pair of current steering transistors;

a common mode node for receiving an input current coupled to the same one of the pair of current passing terminals of each current steering MOS transistor;

a current output terminal coupled to the other of the pair of current passing terminals of the first of the current steering MOS transistors; and a third MOS transistor of the opposite polarity type to the pair of current steering MOS transistors having a gate and a pair of terminals for passing a current through the transistor, the gate of the third MOS transistor being coupled to the gate of the first MOS current steering transistor, and the terminals for passing a current through the third MOS transistor being coupled between the gate of the second MOS current steering transistor and, through a first resistor, to one of the pair of terminals for passing a current through the second MOS current steering transistor, the other of the pair of current passing terminals of the first of the current steering MOS transistors being for connection to a second resistor, the resistance value of the first resistor being $\frac{1}{2} \times 2^n \times R$, wherein n=the number of input bits to the DAC and R=the resistance value of the second resistor.

8. The current steering circuit of claim 7 wherein the first and second current steering MOS transistors are P-channel and the third MOS transistor is N-channel.

9. The current steering circuit of claim 7 wherein the gate of the second MOS current steering transistor is coupled to a first point of fixed potential.

10. The current steering circuit of claim 7 having a pair of conductively biased, cascaded fourth and fifth MOS transistors coupled between a second point of fixed potential of opposite polarity to the first point of fixed potential and the common mode node, for passing current to the common mode node.

11. The current steering circuit of claim 10 wherein the fourth and fifth MOS transistors are the same polarity type as the first and second MOS current steering transistors.

* * * * *